US006829196B1

(12) United States Patent
Balakrishnan

(10) Patent No.: US 6,829,196 B1
(45) Date of Patent: Dec. 7, 2004

(54) METHOD AND APPARATUS FOR PREVENTION OF READ CORRUPTION IN ROTATED-READ REGISTER FILES AND CONTENT ADDRESSABLE MEMORY ARRAYS

(75) Inventor: Karthik Balakrishnan, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/631,379

(22) Filed: Jul. 30, 2003

(51) Int. Cl.$^7$ ................................................ G11C 8/00
(52) U.S. Cl. ............................. 365/230.05; 365/189.04
(58) Field of Search ..................... 365/230.05, 189.04, 365/189.05, 189.08, 221, 230.08

(56) References Cited

U.S. PATENT DOCUMENTS

| | | | | |
|---|---|---|---|---|
| 5,493,536 A | * | 2/1996 | Aoki ..................... | 365/230.05 |
| 5,590,087 A | * | 12/1996 | Chung et al. .......... | 365/230.05 |
| 5,742,557 A | * | 4/1998 | Gibbins et al. ........ | 365/230.05 |
| 6,166,963 A | * | 12/2000 | Wen ...................... | 365/189.04 |
| 6,333,872 B1 | * | 12/2001 | Ouellette et al. ...... | 365/189.06 |

* cited by examiner

Primary Examiner—Anh Phung
(74) Attorney, Agent, or Firm—Gunnison, McKay & Hodgson, L.L.P.; Philip J. McKay

(57) ABSTRACT

Rotated-read register file and CAM array memory structures include corruption prevention circuits that are used to force a read bit line to a known digital value when a cell structure is being written to at the same time a read is performed on the corresponding read word line. Consequently, according to the present invention, the value on the read bit line is forced to a known digital value by the corruption prevention circuit of the invention and the prior art problem of the value being read having an unknown or indeterminate value that is neither a digital low nor a digital high is eliminated. Therefore, using the method and structure of the invention, indeterminate values are never propagated down stream to the sensing elements, logic elements, or other downstream circuitry of the system and there is no potential failure of the downstream circuitry.

30 Claims, 4 Drawing Sheets

US 6,829,196 B1

METHOD AND APPARATUS FOR PREVENTION OF READ CORRUPTION IN ROTATED-READ REGISTER FILES AND CONTENT ADDRESSABLE MEMORY ARRAYS

FIELD OF THE INVENTION

The present invention relates generally to "Rotated Read" register file memory structures and "Content Addressable Memory" structures, and, more particularly, to a method and structure for preventing read corruption in "Rotated Read" register file memory structures and "Content Addressable Memory" structures.

BACKGROUND OF THE INVENTION

As the performance of microprocessors and processing systems has continued to advance, more and more systems have begun to incorporate memory structures other than standard register files that read and write data on a row-by row basis. Two examples of memory structures that are not standard register files are "Rotated-Read" register file memory structures and "Content Addressable Memory" (CAM) arrays. In both rotated-read register file memory structures and CAM arrays data is read a column at a time across a given row rather than on a strictly row-by-row basis.

Using the column reads associated with rotated-read register file memory structures and CAM arrays it is possible, and often happens, that a read operation of a given memory cell can take place at the same time the row containing the memory cell is being written to and before the given cell has been written to. Consequently, two problems result.

The first problem that occurred when a column read operation took place at the same time a row was being written to was that the data read in this situation was incorrect or "bad" data. This "bad" data problem was easily corrected by methods and structures well known to those of skill in the art whereby the "bad" data was ignored and the correct data was read on the next read cycle. Consequently, from an architectural standpoint the "bad" data problem was a non-issue and a non-problem.

However, the second, and far more troublesome, problem that occurred when a column read operation took place at the same time a row was being written to was that the value being read was typically an unknown, or indeterminate, value that was neither a digital zero nor a digital one, i.e., the value read was between a digital low and a digital high. As noted above, from an architectural standpoint, this was a non-issue; the correct data was simply read on the next cycle. However, the indeterminate value read when a column read operation took place at the same time a row was being written to resulted in the indeterminate values being propagated down stream to the sensing elements, logic elements, or other downstream circuitry of the system and, since the indeterminate value was neither a digital low nor a digital high, the downstream circuitry often failed because the downstream circuits were designed to process signals consisting of either a digital low or a digital high but not an intermediate value. Consequently, the effects of the indeterminate value that resulted a column read operation took place at the same time a row was being written to on downstream circuitry was often circuit failure and it was found that correcting this problem in silicon was extremely difficult.

What is needed is a method and apparatus for preventing read corruption in rotated-read register file memory structures and CAM array structures by preventing indeterminate, or intermediate, values from being propagated to sensing elements, logic circuits, or other circuitry downstream from the memory structure and ensuring that the sensing elements, logic circuits, or other downstream circuitry receive only defined digital low or digital high signals.

SUMMARY OF THE INVENTION

The present invention is directed to a method and apparatus for preventing read corruption in rotated-read register file memory structures and CAM array structures by preventing indeterminate, or intermediate, values from being propagated to sensing elements, logic circuits, or other circuitry downstream from the memory structure and ensuring that the sensing elements, logic circuits, or other downstream circuitry receive only defined digital values.

According to the present invention, corruption prevention circuits are used to force a read bit line to a known digital value by discharging the read bit line when a cell structure is being written to at the same time a read is performed on the corresponding read word line. Consequently, according to the present invention, the value on the read bit line is forced to a known digital value by the corruption prevention circuit of the invention and the prior art problem of the value being read having an unknown or indeterminate value that is neither a digital low nor a digital high is eliminated. Therefore, using the method and structure of the invention, indeterminate values are never propagated down stream to the sensing elements, logic elements, or other downstream circuitry of the system and there is no potential failure of the downstream circuitry.

According to the present invention, corruption prevention circuits are specifically designed to be operatively coupled to the existing write word lines. Since write word lines are already required, there is minimal new structure added. In addition, the corruption prevention circuits of the invention can be placed physically very close to read bit lines, in one embodiment on the order of five to ten microns from the edge of the array. This means that the addition of the corruption prevention circuits of the invention results in minimal additional capacitance and the size of the resulting improved rotated-read memory structure can be kept almost the same as prior art structures.

In addition, the transistors used in the corruption prevention circuits of the invention can be sized very small without adversely effecting the down stream timing, and, in some embodiments of the invention, the addition of corruption prevention circuits of the invention allows for additional delay times by either sizing the corruption prevention circuit components appropriately or by adding well known delay elements to the corruption prevention circuits of the invention.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

The present invention is directed to a method and apparatus for preventing read corruption in rotated-read register file memory structures and CAM array structures (100 In FIG. 1) by preventing indeterminate, or intermediate, values from being propagated to sensing elements, logic circuits, or other circuitry downstream from the memory structure (161 in FIG. 1) and ensuring that the sensing elements, logic circuits, or other downstream circuitry receive only defined digital values.

Figure 1:
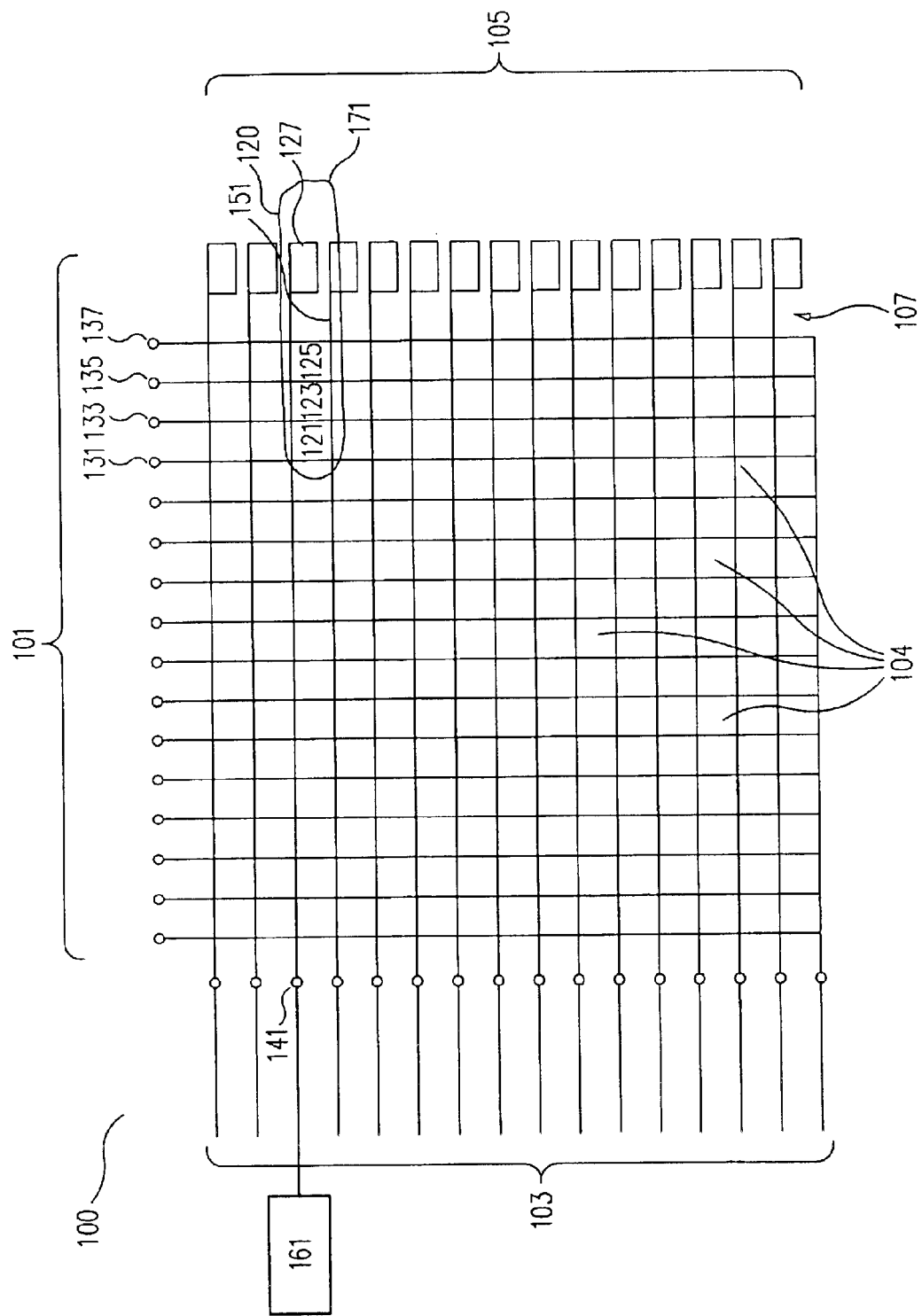
FIG. 1 is a simplified representation of a improved rotated-read memory structure, such as a rotated-read register file memory structure or CAM array, designed according to the principles of the present invention.
Figure 2:
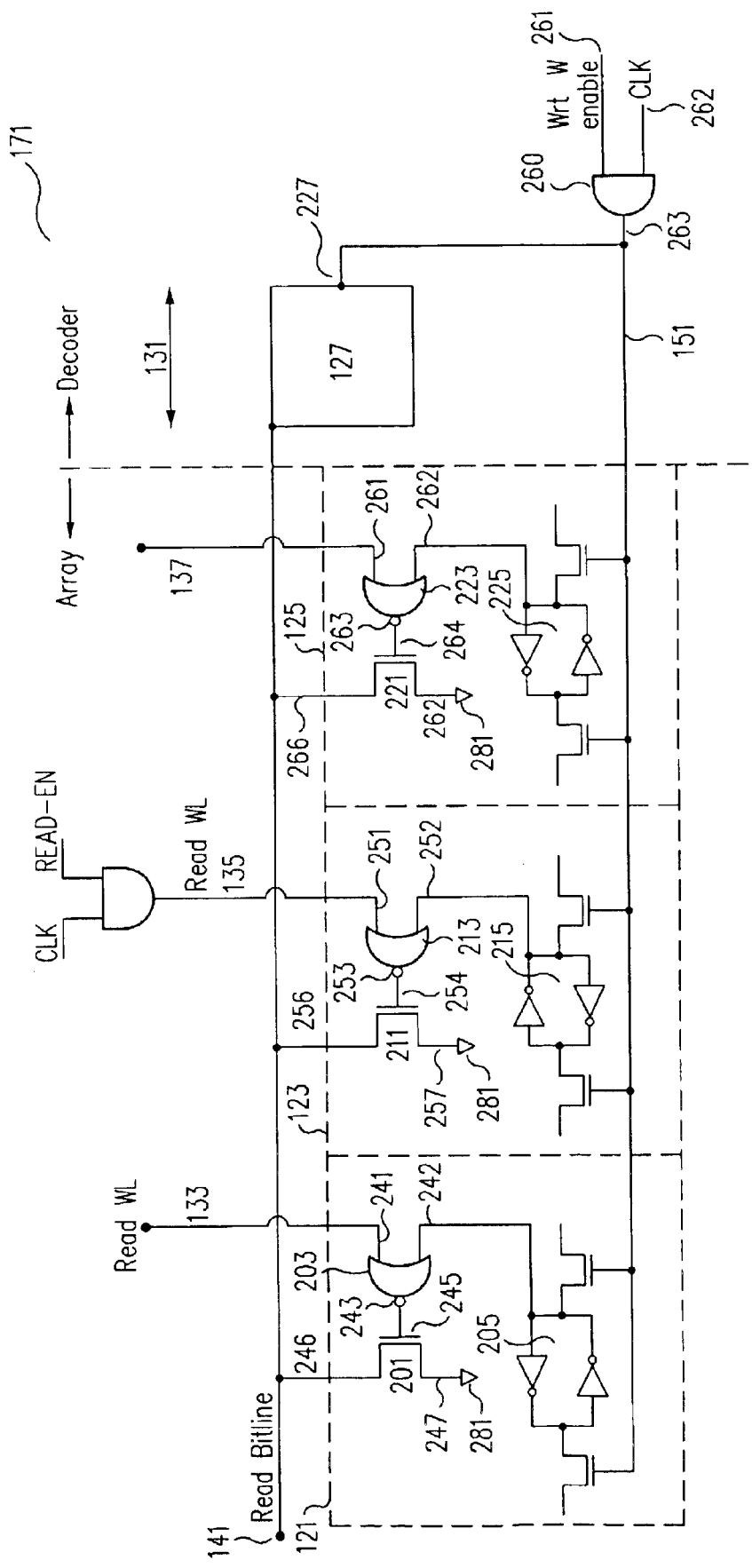
FIG. 2 shows a more detailed representation of an exemplary portion of the improved rotated-read memory structure of FIG. 1 including exemplary cell structures and an exemplary corruption prevention circuit designed according to the principles of the present invention.
Figure 3:
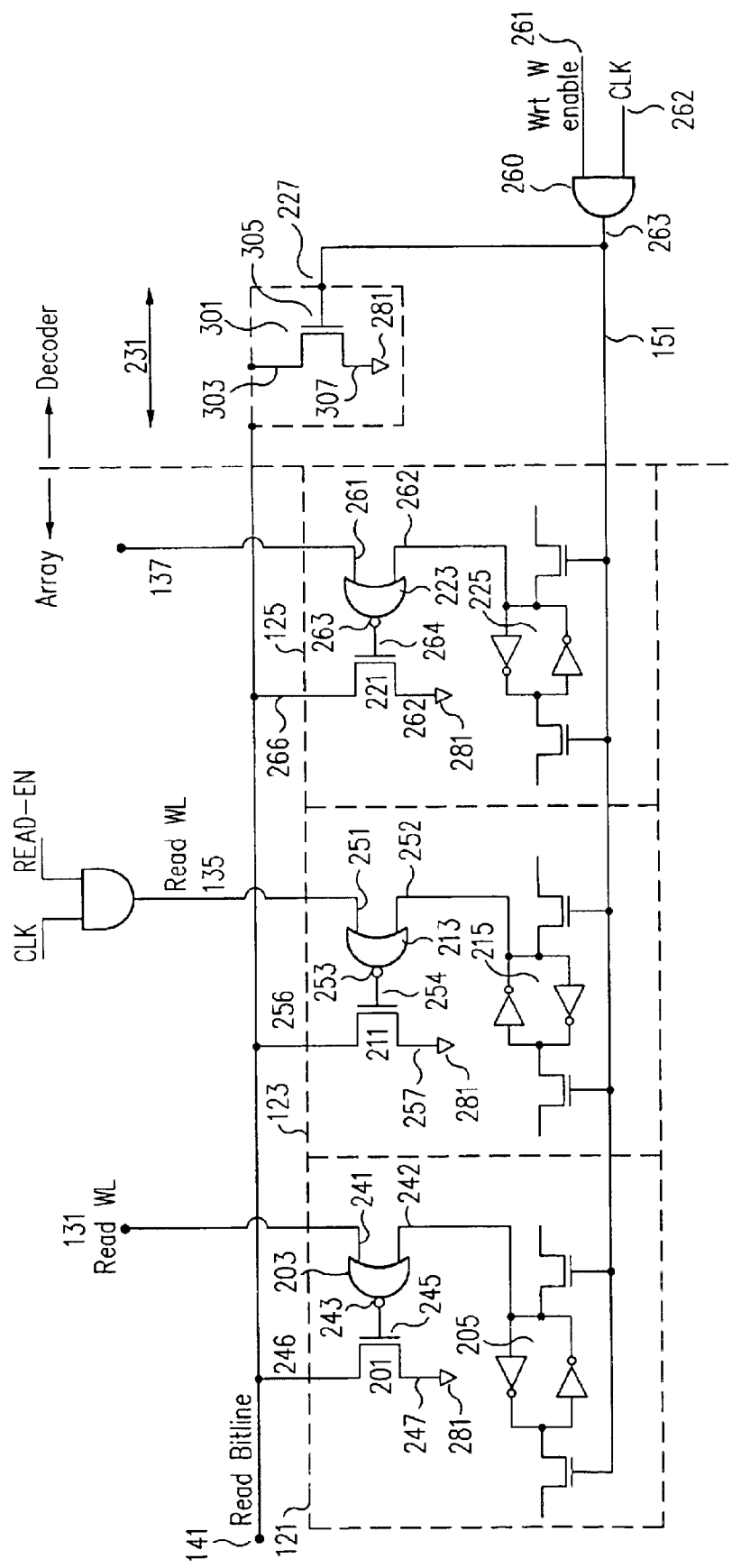
FIG. 3 shows a more detailed representation of an exemplary portion of the improved rotated-read memory structure of FIG. 1 including exemplary cell structures and one embodiment of a corruption prevention circuit comprising a corruption prevention pull-down transistor designed according to the principles of the present invention.
Figure 4:
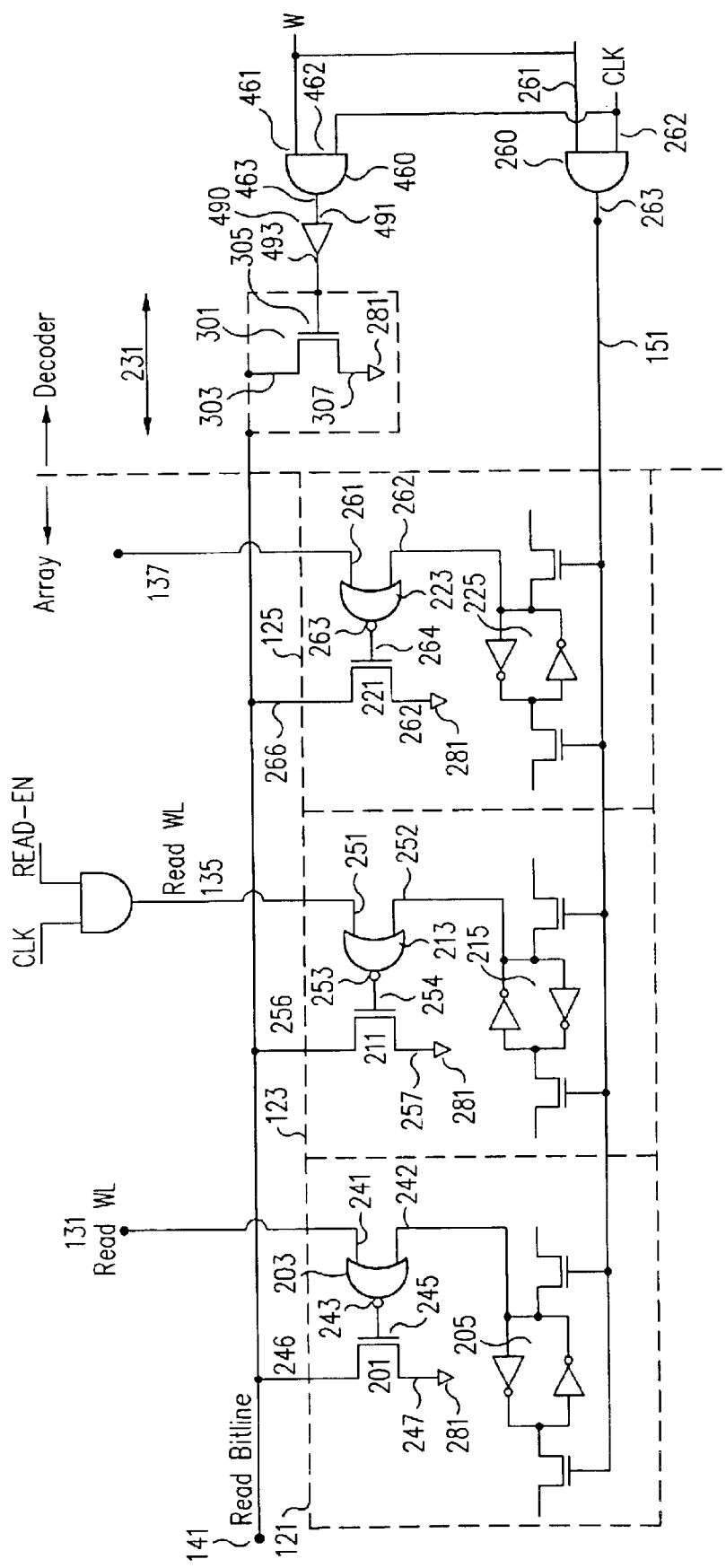
FIG. 4 shows a more detailed representation of an exemplary portion of the improved rotated-read memory structure of FIG. 1 including exemplary cell structures and another embodiment of a corruption prevention circuit comprising a corruption prevention pull-down transistor and a corruption prevention AND gate designed according to the principles of the present invention.

According to the present invention, corruption prevention circuits (105 in FIG. 1, 127 in FIGS. 2, 3, and 4) are used to force a read bit line (141 in FIGS. 2, 3, and 4) to a known digital value by discharging the read bit line when a cell structure (121, 123 and 135 in FIGS. 2, 3, and 4) is being written to at the same time a read is performed on the corresponding read word line (101 in FIG. 1 and 133, 135, and 137 in FIGS. 2, 3, and 4). Consequently, according to the present invention, the value on the read bit line is forced to a known digital value by the corruption prevention circuit and the prior art problem of the value being read having an unknown or indeterminate value that is neither a digital low nor a digital high is eliminated. Therefore, using the method and structure of the invention, indeterminate values are never propagated down stream to the sensing elements, logic elements, or other downstream circuitry of the system and there is no potential failure of the downstream circuitry.

According to the present invention, corruption prevention circuits are specifically designed to be operatively coupled to the existing write word lines 107 in FIG. 1 and 151 in FIGS. 2, 3, and 4). Since write word lines are already required, there is, according to the invention, minimal new structure added. In addition, the corruption prevention circuits of the invention can be placed physically very close to read bit lines (141 in FIGS. 1, 2, 3, and 4), in one embodiment on the order of five to ten microns from the edge of the array. This means that the addition of the corruption prevention circuits of the invention results in minimal additional capacitance and the size of the resulting improved rotated-read memory structure can be kept almost the same as prior art structures.

In addition, the transistors (301 in FIG. 3 and 301 in FIG.5) used in the corruption prevention circuits of the invention can be sized very small without adversely effecting the down stream timing. In addition, in some embodiments of the invention, the addition of corruption prevention circuits of the invention allows for additional delay times by either sizing the corruption prevention circuit components (460 in FIG. 4) appropriately or by adding well known delay elements (490 in FIG. 4) to the corruption prevention circuits of the invention.

FIG. 1 is a simplified representation of a improved rotated-read memory structure 100, such as a rotated-read register file memory structure or CAM array, designed according to the principles of the present invention. As seen in FIG. 1, improved rotated-read memory structure 100 includes: cell structures 104, including exemplary cell structures 121, 123 and 125; read word lines 101, including exemplary read word lines 133, 135 and 137; read bit lines 103, including exemplary read bit line 141; write word lines 107, including exemplary write word line 151; and corruption prevention circuits 105, including exemplary corruption prevention circuit 127.

As also shown in FIG. 1, according to one embodiment of the present invention, each of write word lines 107 is operatively coupled to a corresponding one of corruption prevention circuits 105. As an example, exemplary write word line 151 is operatively coupled to exemplary corruption prevention circuit 127. In addition, as those of skill in the art will readily recognize, each of read bit lines 103 would be coupled to downstream circuitry such as the sensing elements, logic elements, or other downstream circuitry. As an example, exemplary read bit line 141 is shown operatively coupled to exemplary downstream circuit 161.

As noted above, in one embodiment of the invention, improved rotated-read memory structure 100 is either a rotated-read register file memory structure or CAM array. In addition, in one embodiment of the invention, improved rotated-read memory structure 100 is comprised of full-swing single-ended read logic and is an "A" phase domino logic structure wherein the read and write operations take place in the same phase, i.e., the "A" phase. In addition those of skill in the art will readily recognize the size, i.e., the number of rows and columns of improved rotated-read memory structure 100 shown in FIG. 1 was chosen arbitrarily for illustrative purposes only and that in practice the invention can be applied to any size memory.

As shown in FIG. 1 and discussed above, according to the present invention improved rotated-read memory structure 100 includes a set of corruption prevention circuits 105 with each corruption prevention circuit 105 operatively coupled to a corresponding one of write word lines 107. According to the present invention, and as discussed in more detail with respect to FIG. 2, the purpose of corruption prevention circuits 105 is to force a known digital value onto a corresponding one of read bit lines 141 when a cell structure of a given row is being written to at the same time a read is performed. As also discussed below, according to the present invention, corruption prevention circuits 105 are specifically designed to be operatively coupled to the existing write word lines 107 since write word lines 107 are already employed. Consequently, according to the invention, there is minimal new structure added.

Those of skill in the art will recognize that while the corruption prevention circuits 105 of the invention are shown in FIG. 1 as being operatively coupled to the right side of improved rotated-read memory structure 100, corruption prevention circuits 105 could as easily be coupled to the left side of improved rotated-read memory structure 100 with minimal structural modification.

FIG. 2 shows a more detailed representation of the exemplary portion 171 of improved rotated-read memory structure 100 of FIG. 1 including exemplary cell structures 121, 123 and 125 and exemplary corruption prevention circuit 127. As seen in FIG. 2, exemplary portion 171 of improved rotated-read memory structure 100 includes exemplary read word lines 133, 135 and 137. In exemplary cell structure 121, exemplary read word line 133 is coupled to a first input 241 of NOR gate 203 and data cell 205 is coupled to second input 242 of NOR gate 203. An output 243 of NOR gate 203 is coupled to a gate 245 of pull down transistor 201. A first flow electrode 246 of pull down transistor 201 is coupled to exemplary read bit line 141 and a second flow electrode 247 of pull down transistor 201 is coupled to a supply voltage 281.

Likewise, in exemplary cell structure 123, exemplary read word line 135 is coupled to a first input 251 of NOR gate 213 and data cell 215 is coupled to second input 252 of NOR gate 213. An output 253 of NOR gate 213 is coupled to a gate 254 of pull down transistor 211. A first flow electrode 256 of pull down transistor 211 is coupled to exemplary read bit line 141 and a second flow electrode 257 of pull down transistor 211 is coupled to supply voltage 281.

Likewise, in exemplary cell structure 125, exemplary read word line 137 is coupled to a first input 261 of NOR gate 223 and data cell 225 is coupled to second input 262 of NOR gate 223. An output 263 of NOR gate 223 is coupled to a gate 264 of pull down transistor 221. A first flow electrode 266 of pull down transistor 221 is coupled to exemplary read bit line 141 and a second flow electrode 267 of pull down transistor 221 is coupled to supply voltage 281.

As also shown in FIG. 2, portion 171 of improved rotated-read memory structure 100 includes write word line AND gate 260 with write word enable input 261 and clock signal input 262. In one embodiment, output 263 of AND gate 260 is operatively coupled to exemplary write word line 151 and a first terminal 227 of exemplary corruption prevention circuit 127. A second terminal 237 of exemplary corruption prevention circuit 127 is coupled to exemplary read bit line 141.

As discussed above, according to the present invention, exemplary corruption prevention circuit 127 is used to force a known digital value onto exemplary read bit line 141 when a cell structure, such as exemplary cell structures 121, 123 or 125, is being written to at the same time a read is performed on the corresponding read bit line 141. Consequently, according to the present invention, the value on exemplary read bit line 141 is forced to a digital low or a digital high by corruption prevention circuit 127 and the prior art problem of the value being read having an unknown or indeterminate value that is neither a digital zero nor a digital one is eliminated. Therefore, using the method and structure of the invention, indeterminate values are never propagated down stream to the sensing elements, logic elements, or other downstream circuitry of the system (not shown) and there is no potential failure of the downstream circuitry.

FIG. 3, like FIG. 2, shows a more detailed representation of the exemplary portion 171 of improved rotated-read memory structure 100 of FIG. 1 including a specific embodiment of an exemplary corruption prevention circuit 127 that comprises a corruption prevention pull down transistor 301. As with FIG. 2, FIG. 3 shows exemplary cell structures 121, 123 and 125 and exemplary corruption prevention circuit 127. As seen in FIG. 3, exemplary portion 171 of improved rotated-read memory structure 100 includes exemplary read word lines 133, 135 and 137. In exemplary cell structure 121, exemplary read word line 133 is coupled to a first input 241 of NOR gate 203 and data cell 205 is coupled to second input 242 of NOR gate 203. An output 243 of NOR gate 203 is coupled to a gate 245 of pull down transistor 201. A first flow electrode 246 of pull down transistor 201 is coupled to exemplary read bit line 141 and a second flow electrode 247 of pull down transistor 201 is coupled to supply voltage 281.

Likewise, in exemplary cell structure 123, exemplary read word line 135 is coupled to a first input 251 of NOR gate 213 and data cell 215 is coupled to second input 252 of NOR gate 213. An output 253 of NOR gate 213 is coupled to a gate 254 of pull down transistor 211. A first flow electrode 256 of pull down transistor 211 is coupled to exemplary read bit line 141 and a second flow electrode 257 of pull down transistor 211 is coupled to supply voltage 281.

Likewise, in exemplary cell structure 125, exemplary read word line 137 is coupled to a first input 261 of NOR gate 223 and data cell 225 is coupled to second input 262 of NOR gate 223. An output 263 of NOR gate 223 is coupled to a gate 264 of pull down transistor 221. A first flow electrode 266 of pull down transistor 221 is coupled to exemplary read bit line 141 and a second flow electrode 267 of pull down transistor 221 is coupled to supply voltage 281.

As also shown in FIG. 3, portion 171 of improved rotated-read memory structure 100 includes write word line AND gate 260 with write word enable input 261 and clock signal input 262. Output 263 of AND gate 260 is operatively coupled to exemplary write word line 151. According to this embodiment of the invention, output 263 of AND gate 260 is also operatively coupled to a gate 305 of corruption prevention pull down transistor 301 and a first flow electrode 303 of corruption prevention pull down transistor 301 is coupled to exemplary read bit line 141. Second flow electrode 307 of corruption prevention pull down transistor 301 is coupled to supply voltage 281.

In this embodiment of the invention, exemplary corruption prevention circuit 127, and corruption prevention pull down transistor 301, is used to force a digital low value onto read bit line 141 by discharging exemplary read bit line 141 when a cell structure, such as exemplary cell structures 121, 123 or 125, is being written to at the same time a read is performed on the corresponding read word line 133, 135 or 137. Consequently, according to the present invention, the value on exemplary read bit line 141 is forced to a digital low by corruption prevention circuit 127 and the prior art problem of the value being read having an unknown or indeterminate value that is neither a digital zero nor a digital one is eliminated. Therefore, using the method and structure of the invention, indeterminate values are never propagated down stream to the sensing elements, logic elements, or other downstream circuitry of the system (not shown) and there is no potential failure of the downstream circuitry.

As discussed above, in the embodiment of the invention shown in FIG. 3, improved rotated-read memory structure 100 is either a rotated-read register file memory structure or CAM array. In addition, in one embodiment, improved rotated-read memory structure 100 is comprised of full-swing single-ended read logic and is an "A" phase domino logic structure wherein the read and write operations take place in the same phase, i.e., the "A" phase. In addition, those of skill in the art will readily recognize the exemplary portion 171 of improved rotated-read memory structure 100 shows only a portion of one row of improved rotated-read memory structure 100. Consequently, as shown in FIG. 1, according to the present invention, each row of improved rotated-read memory structure 100, would have a structure identical to FIG. 3 at one of its ends. In addition, as discussed above, the size, i.e., the number of rows and columns of improved rotated-read memory structure 100 shown in FIG. 1 was chosen arbitrarily for illustrative purposes only and that in practice the invention can be applied to any size memory. As also discussed above, those of skill in the art will recognize that while the exemplary corruption prevention circuit 127 of the invention is shown in FIG. 3 as being operatively coupled to the right side of improved rotated-read memory structure 100, corruption prevention circuits of the invention could as easily be coupled to the left side of improved rotated-read memory structure 100 with minimal structural modification.

As discussed above, according to the present invention, exemplary corruption prevention circuit 127, and corruption prevention pull down transistor 301, is specifically designed to be operatively coupled to the existing exemplary write word line 151. Since write word line 151 is already required, there is minimal new structure added. In addition, since, in the one embodiment shown in FIG. 3, exemplary corruption prevention circuit 127 comprises corruption prevention pull down transistor 301, corruption prevention pull down transistor 301 can be placed physically very close to exemplary read bit line 141, in one embodiment a distance 231 is on the order of five to ten microns from the edge of the array. This means that the addition of exemplary corruption prevention circuit 127, and corruption prevention pull down transistor 301 results in minimal additional capacitance and the size of the resulting improved rotated-read memory structure 100 can be kept almost the same as prior art structures. In addition, since the read word signal path along exemplary read word lines 133, 135 and 137 is much longer than the signal path from output 263 of write word AND gate 260 to gate 305 of corruption prevention pull down transistor 301, corruption prevention pull down transistor 301 can be sized very small without adversely effecting the down stream timing.

FIG. 4, like FIG. 2 and FIG. 3, shows a more detailed representation of the exemplary portion 171 of improved rotated-read memory structure 100 of FIG. 1 including a specific embodiment of an exemplary corruption prevention circuit 127 that comprises a corruption prevention pull down transistor 301, a corruption prevention AND gate 460 and a delay element 490. As with FIG. 3, FIG. 4 shows exemplary cell structures 121, 123 and 125 and exemplary corruption prevention circuit 127. As seen in FIG. 4, exemplary portion 171 of improved rotated-read memory structure 100 includes exemplary read word lines 133, 135 and 137. In exemplary cell structure 121, exemplary read word line 133 is coupled to a first input 241 of NOR gate 203 and data cell 205 is coupled to second input 242 of NOR gate 203. An output 243 of NOR gate 203 is coupled to a gate 245 of pull down transistor 201. A first flow electrode 246 of pull down transistor 201 is coupled to exemplary read bit line 141 and a second flow electrode 247 of pull down transistor 201 is coupled to supply voltage 281.

Likewise, in exemplary cell structure 123, exemplary read word line 135 is coupled to a first input 251 of NOR gate 213 and data cell 215 is coupled to second input 252 of NOR gate 213. An output 253 of NOR gate 213 is coupled to a gate 254 of pull down transistor 211. A first flow electrode 256 of pull down transistor 211 is coupled to exemplary read bit line 141 and a second flow electrode 257 of pull down transistor 211 is coupled to supply voltage 281.

Likewise, in exemplary cell structure 125, exemplary read word line 137 is coupled to a first input 261 of NOR gate 223 and data cell 225 is coupled to second input 262 of NOR gate 223. An output 263 of NOR gate 223 is coupled to a gate 264 of pull down transistor 221. A first flow electrode 266 of pull down transistor 221 is coupled to exemplary read bit line 141 and a second flow electrode 267 of pull down transistor 221 is coupled to supply voltage 281.

As also shown in FIG. 4, portion 171 of improved rotated-read memory structure 100 includes write word line AND gate 260 with write word enable input 261 and clock signal input 262. Output 263 of AND gate 260 is operatively coupled to exemplary write word line 151, In this embodiment of the invention, write word enable input 261 of write word line AND gate 260 is coupled to a write word enable input 461 of corruption prevention AND gate 460 and clock signal input 262 of write word line AND gate 260 is coupled to a clock signal input 462 of corruption prevention AND gate 460.

According to this embodiment of the invention, output 463 of corruption prevention AND gate 460 is operatively coupled to input 491 of delay element 490 and output 493 of delay element 490 is operatively coupled to a gate 305 of corruption prevention pull down transistor 301 and a first flow electrode 303 of corruption prevention pull down transistor 301 is coupled to exemplary read bit line 141, Second flow electrode 307 of corruption prevention pull down transistor 301 is coupled to supply voltage 281.

In this embodiment of the invention, exemplary corruption prevention circuit 127, and corruption prevention pull down transistor 301 and corruption prevention AND gate 460, are used to force a digital low value onto read bit line 141 by discharging exemplary read bit line 141 when a cell structure, such as exemplary cell structures 121, 123 or 125, is being written to at the same time a read is performed on the corresponding read word line 133, 135 or 137. Consequently, according to the present invention, the value on exemplary read bit line 141 is forced to a digital low by corruption prevention circuit 127 and the prior art problem of the value being read having an unknown or indeterminate value that is neither a digital zero nor a digital one is eliminated. Therefore, using the method and structure of the invention, indeterminate values are never propagated down stream to the sensing elements, logic elements, or other downstream circuitry of the system (not shown) and there is no potential failure of the downstream circuitry.

As discussed above, in the embodiment of the invention shown in FIG. 4, improved rotated-read memory structure 100 is either a rotated-read register file memory structure or CAM array. In addition, in one embodiment, improved rotated-read memory structure 100 is comprised of full-awing single-ended read logic and is an "A" phase domino logic structure wherein the read and write operations take place in the same phase, i.e., the "A" phase. In addition, those of skill in the art will readily recognize the exemplary portion 171 of improved rotated-read memory structure 100 shows only a portion of one row of improved rotated-read memory structure 100. Consequently, as shown in FIG. 1, according to the present invention, each row of improved rotated-read memory structure 100, would have a structure identical to FIG. 4 at one of its ends. In addition, as discussed above, the size, i.e., the number of rows and columns of improved rotated-read memory structure 100 shown in FIG. 1 was chosen arbitrarily for illustrative purposes only and that in practice the invention can be applied to any size memory. As also discussed above, those of skill in the art will recognize that while the exemplary corruption prevention circuit 127 of the invention is shown in FIG. 4 as being operatively coupled to the right side of improved rotated-read memory structure 100, corruption prevention circuits of the invention could as easily be coupled to the left side of improved rotated-read memory structure 100 with minimal structural modification.

As discussed above, according to the present invention, exemplary corruption prevention circuit 127, and corruption prevention pull down transistor 301 and corruption prevention AND gate 460, is specifically designed to be operatively coupled to the existing exemplary write word line 151. Since write word line 151 is already required, there is minimal new structure added. In addition, since, in the one embodiment shown in FIG. 4, exemplary corruption prevention circuit 127 comprises corruption prevention pull down transistor 301 and corruption prevention AND gate 460, corruption prevention pull down transistor 301 can be physically very close to exemplary read bit line 141, in one embodiment a distance 231 is on the order of five to ten microns from the edge of the array. This means that the addition of exemplary corruption prevention circuit 127, and corruption prevention pull down transistor 301 and corruption prevention AND gate 460, results in minimal additional capacitance and the size of the resulting improved rotated-read memory structure 100 can be kept almost the same as prior art structures.

In addition, since the read word signal path along exemplary read word lines 133, 135 and 137 is much longer than the signal path from output 463 of write word AND gate 460 to gate 305 of corruption prevention pull down transistor 301, corruption prevention pull down transistor 301 can be sized very small without adversely effecting the down stream timing. In addition, in this embodiment of the invention, the addition of corruption prevention AND gate 460 allows for additional delay times if needed by either sizing corruption prevention AND gate 460 appropriately or by adding well know delay elements, such as delay element 490, to the output 463 of corruption prevention AND gate 460.

As shown above, according to the present invention, corruption prevention circuits are used to force a read bit line to a known digital value by discharging the read bit line when a cell structure is being written to at the same time a read is performed on the corresponding read word line. Consequently, according to the present invention, the value on the read bit line is forced to a known digital value by the corruption prevention circuits of the invention and the prior art problem of the value being read having an unknown or indeterminate value that is neither a digital zero nor a digital one is eliminated. Therefore, using the method and structure of the invention, indeterminate values are never propagated down stream to the sensing elements, logic elements, or other downstream circuitry of the system and there is no potential failure of the downstream circuitry.

As discussed above, according to the present invention, corruption prevention circuits are specifically designed to be operatively coupled to the existing write word lines. Since write word lines are already required, there is minimal new structure added. In addition, the corruption prevention circuits of the invention can be placed physically very close to the read bit lines, in one embodiment on the order of five to ten microns from the edge of the array. This means that the addition of the corruption prevention circuits of the invention results in minimal additional capacitance and the size of the resulting improved rotated-read memory structure can be kept almost the same as prior art structures.

In addition, the transistors used in the corruption prevention circuits of the invention can be sized very small without adversely effecting the down stream timing. In addition, in some embodiments of the invention, the addition of corruption prevention circuits of the invention allows for additional delay times by either sizing the corruption prevention circuit components appropriately or by adding well known delay elements to the corruption prevention circuits of the invention.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For instance, as noted above, those of skill in the art will readily recognize the size, i.e., the number of rows and columns of improved rotated-read memory structure 100 shown in FIG. 1 was chosen arbitrarily for illustrative purposes only and that in practice the invention can be applied to any size memory.

In addition, those of skill in the art will recognize that while the corruption prevention circuits 105 of the invention are shown in FIG. 1 as being operatively coupled to the right aide of improved rotated-read memory structure 100, corruption prevention circuits 105 could as easily be coupled to the left aide of improved rotated-read memory structure 100 with minimal structural modification.

In addition, specific logic with specific gate and other structures was shown in the FIGS. for illustrative purposes only. Those of skill in the art will readily recognize that these specific structures could be readily exchanged, or modified, without departing from the scope and spirit of the present invention.

Consequently, the scope of the invention is defined by the claims and their equivalents.

What is claimed is:

1. An improved memory structure comprising:
   a memory structure, said memory structure comprising:
      at least one memory cell structure;
      at least one write word line operatively coupled to said at least one memory cell structure;
      at least one read word line operatively coupled to said at least one memory cell structure;
      at least one read bit line operatively coupled to said at least one memory cell structure; and
      a corruption prevention circuit operatively coupled to said at least one write word line and said memory cell structure such that when a read operation is enabled for said at least one memory cell structure during a write operation for said at least one memory cell structure, said corruption prevention circuit forces said at least one read bit line to a known digital value.

2. The improved memory structure of claim 1, wherein; said known digital value is a digital low value.

3. The improved memory structure of claim 2, wherein; said corruption prevention circuit is operatively coupled to said at least one write word line and said memory cell structure such that when a read operation is enabled for said at least one memory cell structure during a write operation for said at least one memory cell structure, said corruption prevention circuit causes said read bit line to be discharged.

4. The improved memory structure of claim 1, wherein; said memory structure is a rotated-read register file.

5. The improved memory structure of claim 4, wherein; said known digital value is a digital low value.

6. The improved memory structure of claim 5, wherein;
said corruption prevention circuit is operatively coupled to said at least one write word line and said memory cell structure such that when a read operation is enabled for said at least one memory cell structure during a write operation for said at least one memory cell structure, said corruption prevention circuit causes said read bit line to be discharged.

7. The improved memory structure of claim 1, wherein;
said memory structure is a Content Addressable Memory array.

8. The improved memory structure of claim 7, wherein;
said known digital value is a digital low value.

9. The improved memory structure of claim 8, wherein;
said corruption prevention circuit is operatively coupled to said at least one write word line and said memory cell structure such that when a read operation is enabled for said at least one memory cell structure during a write operation for said at least one memory cell structure, said corruption prevention circuit causes said read bit line to be discharged.

10. An improved memory structure comprising:
a memory structure, said memory structure comprising:
  at least one memory cell structure, said at least one memory cell structure comprising:
    a memory cell structure pull-down transistor, said memory cell structure pull-down transistor having a memory cell structure pull-down transistor first flow electrode, a memory cell structure pull-down transistor second flow electrode, and a memory cell structure pull-down transistor control electrode;
    a logic gate operatively coupled to said memory cell structure pull-down transistor control electrode;
    a memory cell operatively coupled to said logic gate; and
    a supply voltage operatively coupled to said memory cell structure pull-down transistor second flow electrode;
  at least one write word line operatively coupled to said memory cell of said at least one memory cell structure;
  at least one read word line operatively coupled to said logic gate of said at least one memory cell structure;
  at least one read bit line operatively coupled to said first flow electrode of said memory cell structure pull-down transistor of said at least one memory cell structure; and
  a corruption prevention circuit operatively coupled to said at least one write word line and said memory cell structure such that when a read operation is enabled for said at least one memory cell structure during a write operation for said at least one memory cell structure, said corruption prevention circuit forces said at least one read bit line to a known digital value.

11. The improved memory structure of claim 10, wherein;
said known digital value is a digital low value.

12. The improved memory structure of claim 11, wherein;
said corruption prevention circuit is operatively coupled to said at least one write word line and said memory cell structure such that when a read operation is enabled for said at least one memory cell structure during a write operation for said at least one memory cell structure, said corruption prevention circuit causes said read bit line to be discharged.

13. The improved memory structure of claim 12, wherein;
said corruption prevention circuit comprises:
  a corruption prevention circuit pull-down transistor, said corruption prevention circuit pull-down transistor having a corruption prevention circuit pull-down transistor first flow electrode, a corruption prevention circuit pull-down transistor second flow electrode, and a corruption prevention circuit pull-down transistor control electrode, said corruption prevention circuit pull-down transistor first flow electrode being coupled to said at least one read bit line, said corruption prevention circuit pull-down transistor second flow electrode being coupled to said supply voltage, said corruption prevention circuit pull-down transistor control electrode being coupled to said write word line.

14. The improved memory structure of claim 10, wherein;
said memory structure is a rotated-read register file.

15. The improved memory structure of claim 14, wherein;
said known digital value is a digital low value.

16. The improved memory structure of claim 15, wherein;
said corruption prevention circuit is operatively coupled to said at least one write word line and said memory cell structure such that when a read operation is enabled for said at least one memory cell structure during a write operation for said at least one memory cell structure, said corruption prevention circuit causes said read bit line to be discharged.

17. The improved memory structure of claim 16, wherein;
said corruption prevention circuit comprises:
  a corruption prevention circuit pull-down transistor, said corruption prevention circuit pull-down transistor having a corruption prevention circuit pull-down transistor first flow electrode, a corruption prevention circuit pull-down transistor second flow electrode, and a corruption prevention circuit pull-down transistor control electrode, said corruption prevention circuit pull-down transistor first flow electrode being coupled to said at least one read bit line, said corruption prevention circuit pull-down transistor second flow electrode being coupled to said supply voltage, said corruption prevention circuit pull-down transistor control electrode being coupled to said write word line.

18. The improved memory structure of claim 10, wherein;
said memory structure is a Content Addressable Memory array.

19. The improved memory structure of claim 18, wherein;
said known digital value is a digital low value.

20. The improved memory structure of claim 19, wherein;
said corruption prevention circuit is operatively coupled to said at least one write word line and said memory cell structure such that when a read operation is enabled for said at least one memory cell structure during a write operation for said at least one memory cell structure, said corruption prevention circuit causes said read bit line to be discharged.

21. The improved memory structure of claim 20, wherein;
said corruption prevention circuit comprises:
  a corruption prevention circuit pull-down transistor, said corruption prevention circuit pull-down transistor having a corruption prevention circuit pull-down transistor first flow electrode, a corruption prevention circuit pull-down transistor second flow electrode, and a corruption prevention circuit pull-down transistor control electrode, said corruption prevention circuit pull-down transistor first flow electrode being coupled to said at least one read bit line, said corruption prevention circuit pull-down transistor second flow electrode being coupled to said supply voltage, said corruption prevention circuit pull-down transistor control electrode being coupled to said write word line.

22. A method for preventing corruption of data in a memory structure comprising:

providing a memory structure, said memory structure comprising at least one memory cell structure;

operatively coupling at least one write word line to said at least one memory cell structure;

operatively coupling at least one read word line to said at least one memory cell structure;

operatively coupling at least one read bit line to said at least one memory cell structure; and operatively coupling a corruption prevention circuit to said at least one write word line and said memory cell structure such that when a read operation is enabled for said at least one memory cell structure during a write operation for said at least one memory cell structure, said corruption prevention circuit forces said at least one read bit line to a known digital value.

23. The method for preventing corruption of data in a memory structure of claim 22, wherein;

said known digital value is a digital low value.

24. The method for preventing corruption of data in a memory structure of claim 23, wherein;

said corruption prevention circuit is operatively coupled to said at least one write word line and said memory cell structure such that when a read operation is enabled for said at least one memory cell structure during a write operation for said at least one memory cell structure, said corruption prevention circuit causes said read bit line to be discharged.

25. The method for preventing corruption of data in a memory structure of claim 22, wherein;

said memory structure is a rotated-read register file.

26. The method for preventing corruption of data in a memory structure of claim 25, wherein;

said known digital value is a digital low value.

27. The method for preventing corruption of data in a memory structure of claim 26, wherein;

said corruption prevention circuit is operatively coupled to said at least one write word line and said memory cell structure such that when a read operation is enabled for said at least one memory cell structure during a write operation for said at least one memory cell structure, said corruption prevention circuit causes said read bit line to be discharged.

28. The method for preventing corruption of data in a memory structure of claim 22, wherein;

said memory structure is a Content Addressable Memory array.

29. The method for preventing corruption of data in a memory structure of claim 28, wherein;

said known digital value is a digital low value.

30. The method for preventing corruption of data in a memory structure of claim 29, wherein;

said corruption prevention circuit is operatively coupled to said at least one write word-line and said memory cell structure such that when a read operation is enabled for said at least one memory cell structure during a write operation for said at least one memory cell structure, said corruption prevention circuit causes said read bit line to be discharged.

* * * * *